US009484304B2

(12) United States Patent
Okuda et al.

(10) Patent No.: US 9,484,304 B2
(45) Date of Patent: Nov. 1, 2016

(54) SEMICONDUCTOR DEVICE AND METHOD FOR PRODUCING SAME

(71) Applicant: PS4 Luxco S.a.r.l., Luxembourg (LU)

(72) Inventors: Kazuhiro Okuda, Tokyo (JP); Shigeo Ishikawa, Tokyo (JP); Hiroshi Amaike, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/426,117

(22) PCT Filed: Aug. 30, 2013

(86) PCT No.: PCT/JP2013/074000
§ 371 (c)(1),
(2) Date: Mar. 4, 2015

(87) PCT Pub. No.: WO2014/038643
PCT Pub. Date: Mar. 13, 2014

(65) Prior Publication Data
US 2015/0235961 A1 Aug. 20, 2015

(30) Foreign Application Priority Data
Sep. 4, 2012 (JP) .................. 2012-193750

(51) Int. Cl.
*H01L 21/768* (2006.01)
*H01L 23/522* (2006.01)
*H01L 23/532* (2006.01)

(52) U.S. Cl.
CPC ... *H01L 23/53295* (2013.01); *H01L 21/76802* (2013.01); *H01L 21/76877* (2013.01); *H01L 23/5226* (2013.01); *H01L 23/53228* (2013.01)

(58) Field of Classification Search
CPC ............ H01L 21/76802; H01L 21/76877; H01L 23/5226; H01L 23/53295; H01L 2224/13287; H01L 21/0217; H01L 21/76832; H01L 21/76843; H01L 2224/48091
See application file for complete search history.

(56) References Cited

U.S. PATENT DOCUMENTS

| 6,429,518 | B1 | 8/2002 | Endo |
| 2004/0152256 | A1 | 8/2004 | Noguchi et al. |
| 2004/0195582 | A1* | 10/2004 | Tomita .................. H01L 23/585 257/127 |
| 2005/0170633 | A1* | 8/2005 | Sasaki ............... H01L 21/76801 438/622 |
| 2007/0111539 | A1 | 5/2007 | Kon et al. |

FOREIGN PATENT DOCUMENTS

| EP | 1122769 A1 | 8/2001 |
| EP | 1786028 A1 | 5/2007 |

(Continued)

OTHER PUBLICATIONS

International Search Report (ISR) (PCT Form PCT/ISA/210), in PCT/JP2013/074000, dated Dec. 10, 2013.

*Primary Examiner* — Jasmine Clark
(74) *Attorney, Agent, or Firm* — Kunzler Law Group, PC

(57) ABSTRACT

In order to prevent the detachment of a film which is a constituent part of an interlayer-insulating film, and to prevent a decline in the device properties of a semiconductor device, a semiconductor device is provided with an interlayer-insulating film having, in this order, a carbon-containing silicon nitride (SiCN) film, a first silicon nitride film, and a silicon oxide film or a carbon-containing silicon oxide (SiOC) film.

10 Claims, 17 Drawing Sheets

(56) References Cited

FOREIGN PATENT DOCUMENTS

| JP | 2000-114252 A | 4/2000 |
| JP | 2001-023984 A | 1/2001 |
| JP | 2004-214550 A | 7/2004 |
| JP | 2007-141875 A | 6/2007 |
| KR | 10-2007-0051633 A | 5/2007 |

* cited by examiner

BACKGROUND ART

SEMICONDUCTOR DEVICE AND METHOD FOR PRODUCING SAME

TECHNICAL FIELD

The present invention relates to a semiconductor device and a method for producing the same.

BACKGROUND ART

It is conventional to employ semiconductor devices having various laminated structures.

Patent literature article 1 (Japanese Patent Kokai 2001-23984) discloses a method in which a stopper film and an interlayer film are deposited, after which an IR loss reducing film with an underlying film are deposited, then a trench pattern or a via pattern is formed, and then a barrier film and a seeding film are deposited, after which a Cu damascene wiring line is formed.

PRIOR ART LITERATURE

Patent Literature

Patent literature article 1: Japanese Patent Kokai 2001-23984

SUMMARY OF THE INVENTION

Problems to be Resolved by the Invention

An example in which a damascene process is applied within an interlayer insulating film will be described as an example of the problems in the prior art. FIG. 16 is an enlarged view illustrating a via plug and a wiring line which have been formed within an interlayer insulating film using a damascene process from the prior art. In the prior art there are provided an interlayer insulating film 17 comprising a silicon dioxide film, and an interlayer insulating film 18 in which a low dielectric-constant barrier film 18c, comprising a carbon-containing silicon nitride film (SiCN film), and an insulating film 18a, comprising a silicon oxide film or a carbon-containing silicon oxide film (SiOC film), are successively laminated. Also, on the interlayer insulating film 18 is provided an interlayer insulating film 19 in which a low dielectric-constant barrier film 19c comprising a carbon-containing silicon nitride film (SiCN film), and a silicon dioxide film or a carbon-containing silicon oxide film (SiOC film) 19a are successively laminated. Then, a via plug 18b and a wiring line 18d are formed in the interlayer insulating film 18, and a via plug 19b and a wiring line 19d are formed in the interlayer insulating film 19. The via plug 18b, the wiring line 18d, the via plug 19b and the wiring line 19d are electrically connected.

In the semiconductor device in FIG. 16, the adhesion between the SiCN film 18c and the silicon dioxide film or the SiOC film 18a in the interlayer insulating film 18 is low. Similarly, the adhesion between the SiCN film 19c and the silicon dioxide film or the SiOC film 19a in the interlayer insulating film 19 is low. Thus if an assessment such as a pressure cooker test or a highly accelerated temperature and humidity stress test (test procedures, the objective of which is to assess the moisture resistance of an electronic component or the like sealed in resin) is performed, problems arise in that peeling occurs at the interface between the SiCN films 18c, 19c and the silicon dioxide films or the SiOC films 18a, 19a, resulting in a deterioration in the device characteristics of the semiconductor device.

Means of Overcoming the Problems

One mode of embodiment relates to a semiconductor device comprising:

an interlayer insulating film having, in this order, a carbon-containing silicon nitride (SiCN) film, a first silicon nitride film, and a silicon dioxide film or a carbon-containing silicon oxide (SiOC) film.

Another mode of embodiment relates to a method of manufacturing a semiconductor device, comprising:

a step of forming an interlayer insulating film having, in this order, a carbon-containing silicon nitride (SiCN) film, a first silicon nitride film, and a silicon dioxide film or a carbon-containing silicon oxide (SiOC) film.

Advantages of the Invention

It is possible to prevent peeling of the films constituting the interlayer insulating film, and to prevent a deterioration in the device characteristics of the semiconductor device.

MODES OF EMBODYING THE INVENTION

Figure 1:
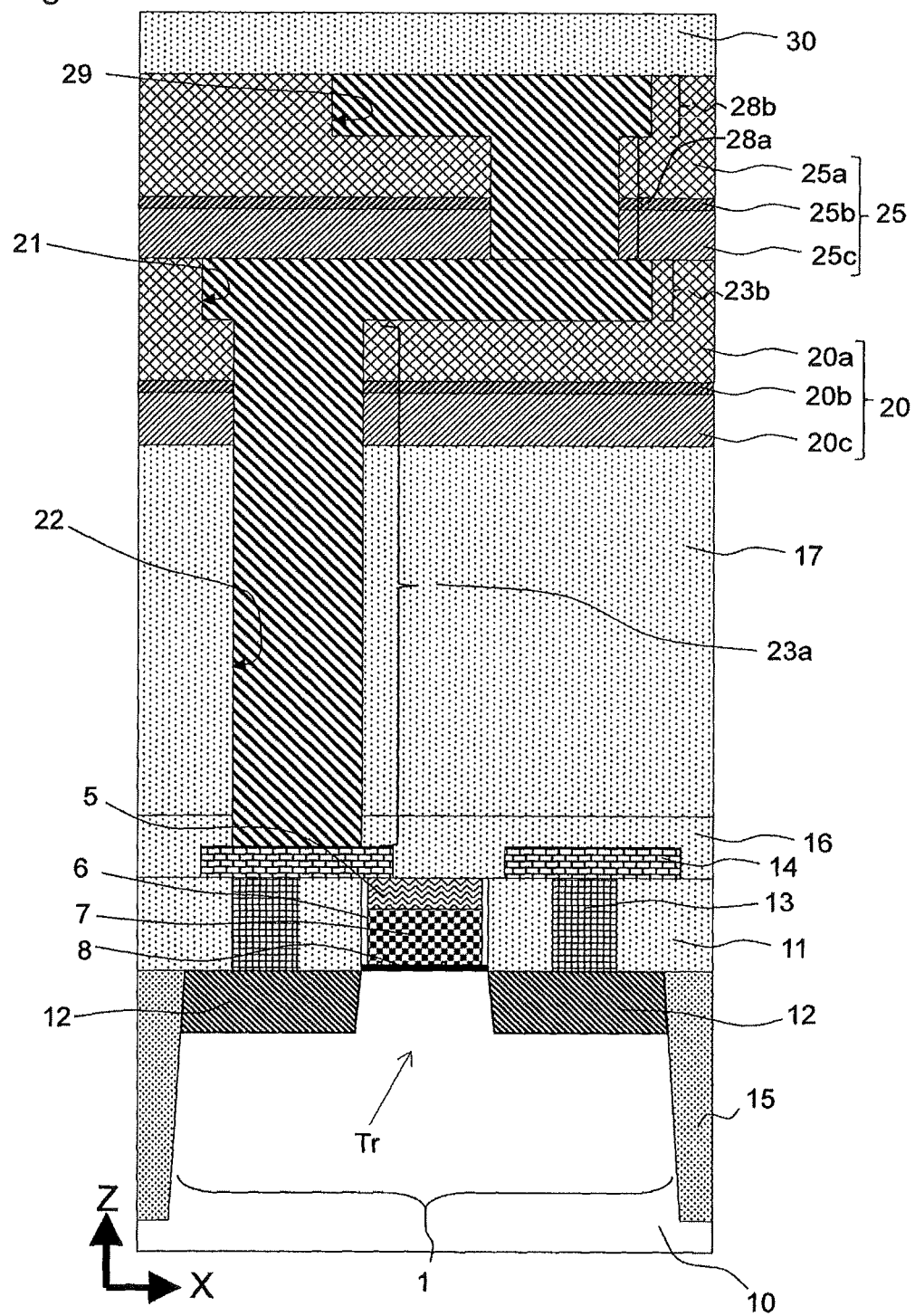
FIG. 1 is a cross-sectional view illustrating a first example of a semiconductor device.

One example of a semiconductor device according to the present invention is provided with an interlayer insulating film having, in this order, a carbon-containing silicon nitride (SiCN) film, a first silicon nitride film, and a silicon dioxide film or a carbon-containing silicon oxide (SiOC) film. Thus the interlayer insulating film has the first silicon nitride film between the carbon-containing silicon nitride (SiCN) film and the silicon dioxide film or the carbon-containing silicon oxide (SiOC) film, and the adhesion between these films can therefore be improved. Thus in an assessment such as a pressure cooker test or a highly accelerated temperature and humidity stress test (test procedures, the objective of which is to assess the moisture resistance of an electronic component or the like sealed in resin), peeling of the films constituting the interlayer insulating film can be prevented. As a result, a deterioration in the device characteristics of the semiconductor device can be prevented.

The interlayer insulating film may in addition have a second silicon nitride film below the carbon-containing silicon nitride (SiCN). In this case the interlayer insulating film comprises the second silicon nitride film, the carbon-containing silicon nitride (SiCN) film, the first silicon nitride film, and the silicon dioxide film or the carbon-containing silicon oxide (SiOC) film. By sandwiching the carbon-containing silicon nitride (SiCN) film between the first and second silicon nitride films in this way, peeling of the films constituting the interlayer insulating film can be more effectively prevented.

Further, a via plug, and a wiring line formed from the same material as the via plug and provided in the interlayer insulating film in such a way that it is in contact with the via plug, may be provided in the interlayer insulating film. Damascene processing may be mentioned by way of example as a method of forming the via plug and the wiring line from the same material. Copper is preferably used as the material for the via plugs and the wiring lines.

In one example of a semiconductor device according to the present invention, a plurality of interlayer insulating films may be laminated such that they lie on top of each other. In this case, the plurality of interlayer insulating films are laminated consecutively, as a first interlayer insulating film, a second interlayer insulating film, a third interlayer insulating film . . . , an $n^{th}$ interlayer insulating film. Further, if via plugs and wiring lines are formed in each interlayer insulating film, it is preferable for the via plugs and the wiring lines formed in each interlayer insulating film to be electrically connected to each other.

Preferred examples of the present invention will now be described in detail with reference to the accompanying drawings. It should be noted that these examples are specific examples given to provide a more in-depth understanding of the present invention, and that the present invention is not in any way restricted to these specific examples.

Example 1

FIG. 1 is a cross-sectional view illustrating this example of a semiconductor device. As illustrated in FIG. 1, in this example of a semiconductor device an active region 1 is demarcated within a semiconductor substrate 10 by being surrounded by an element isolation region 15. A gate insulating film 8, a gate electrode 7 and a cover insulating film 5 are successively laminated directly above a central portion in the X-direction of the active region 1. The gate insulating film 8 comprises a silicon dioxide film, a high dielectric-constant film, or a laminated film comprising a silicon dioxide film and a high dielectric-constant film. The side surfaces of a laminated film comprising the gate electrode 7 and the cover insulating film 5, and the gate insulating film 8, are covered using a side-wall insulating film 6. Source/drain diffusion layers 12 are provided in sections of the active region 1 sandwiching the gate electrode 7 from its left and right sides. The active region 1, the source/drain diffusion layers 12, the gate insulating film 8 and the gate electrode 7 form one transistor Tr. Further, a first interlayer insulating film 11 comprising a silicon dioxide film is provided in such a way as to cover and embed the gate electrode 7. Contacts 13 penetrating through the first interlayer insulating film 11 are connected to the upper surfaces of the source/drain diffusion layers 12. Peripheral wiring lines 14 are disposed in such a way as to be connected to the upper surfaces of the contacts 13. A stopper film 16 and a second interlayer insulating film 17 comprising a silicon dioxide film are provided in such a way as to cover the peripheral wiring lines 14.

Next, a carbon-containing silicon nitride film (SiCN film) 20c, which is a low dielectric-constant barrier film, is provided in such a way as to cover the stopper film 16 and the second interlayer insulating film 17. A first silicon nitride film 20b, serving as a barrier film, and a silicon dioxide film or a carbon-containing silicon oxide film (SiOC film) 20a are further provided on the SiCN film 20c. The SiCN film 20c, the first silicon nitride film 20b, and the silicon dioxide film or the SiOC film 20a form a third interlayer insulating film 20.

A first via plug 23a which penetrates through the stopper film 16 and the second and third interlayer insulating films 17, 20 and is connected to the peripheral wiring line 14, and a first wiring line 23b in contact with the first via plug 23a, are provided. The first via plug 23a and the first wiring line 23b are formed from copper. As discussed hereinafter, the first via plug 23a and the first wiring line 23b are formed by damascene processing.

A carbon-containing silicon nitride film (SiCN film) 25c, which is a low dielectric-constant barrier film, a first silicon nitride film 25b, which is a barrier film, and a silicon dioxide film or a carbon-containing silicon oxide film (SiOC film) 25a are further provided in that order on the upper surfaces of the third interlayer insulating film 20 and the first wiring line 23b. The SiCN film 25c, the first silicon nitride film 25b, and the silicon dioxide film or the SiOC film 25a form a fourth interlayer insulating film 25.

A second via plug 28a which penetrates through the fourth interlayer insulating film 25 and is connected to the first wiring line 23b, and a second wiring line 28b in contact with the second via plug 28a, are provided. The second via plug 28a and the second wiring line 28b are formed from copper. As discussed hereinafter, the second via plug 28a and the second wiring line 28b are formed by damascene processing.

A protective insulating film 30 is further provided on the upper surfaces of the fourth interlayer insulating film 25 and the second wiring line 28b.

In this example, by providing the first silicon nitride film 20b between the SiCN film 20c and the silicon dioxide film or the SiOC film 20a it is possible to improve the adhesion between these films. Thus in an assessment such as a pressure cooker test or a highly accelerated temperature and humidity stress test (test procedures, the objective of which is to assess the moisture resistance of an electronic component or the like sealed in resin), peeling of the films constituting the interlayer insulating film can be prevented. As a result, a deterioration in the device characteristics of the semiconductor device can be prevented.

A method of manufacturing this example of a semiconductor device will now be described with reference to FIGS.

Figure 17:
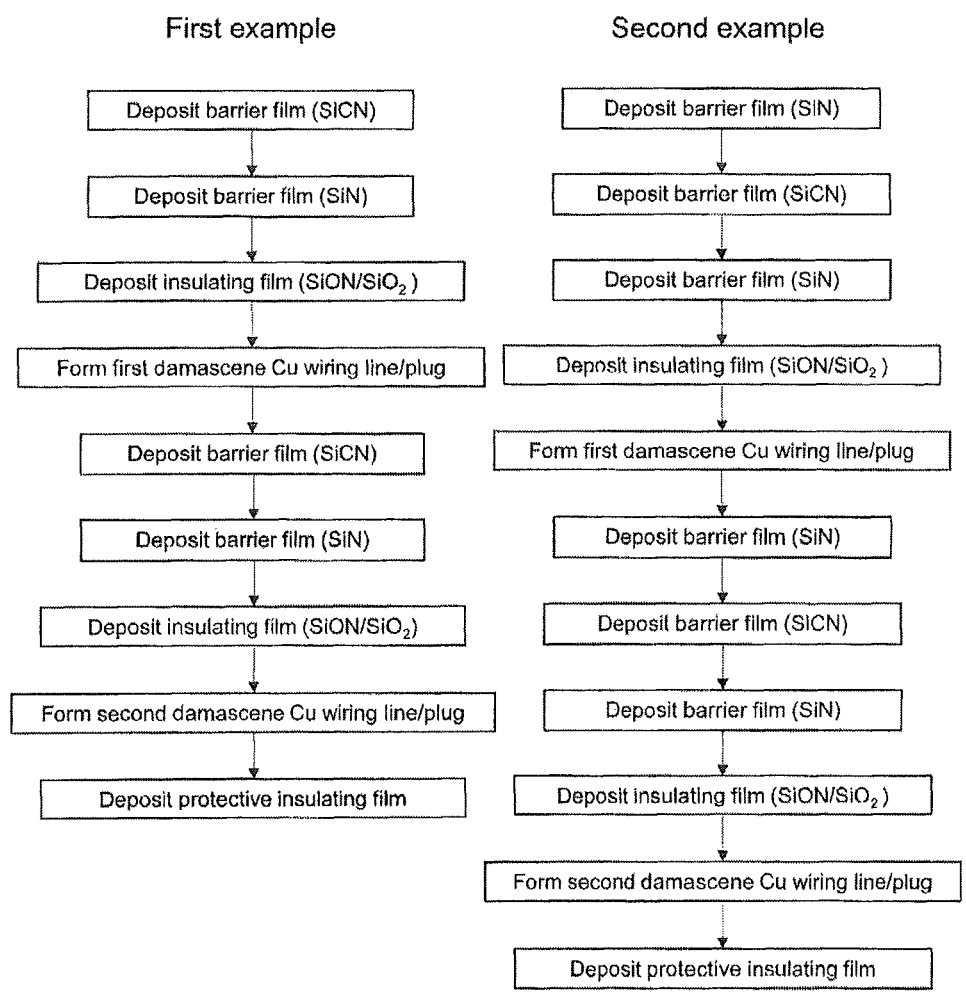
FIG. 17 is a flowchart illustrating the methods of manufacturing the first and second examples of a semiconductor device.

2 to 12 and FIG. 17A. FIGS. 2 to 12 are cross-sectional views corresponding to FIG. 1, and FIG. 17A is a flowchart illustrating this example of a manufacturing method. It should be noted that the structures below the second interlayer insulating film 17 have been omitted from FIGS. 3 to 12.

Figure 2:
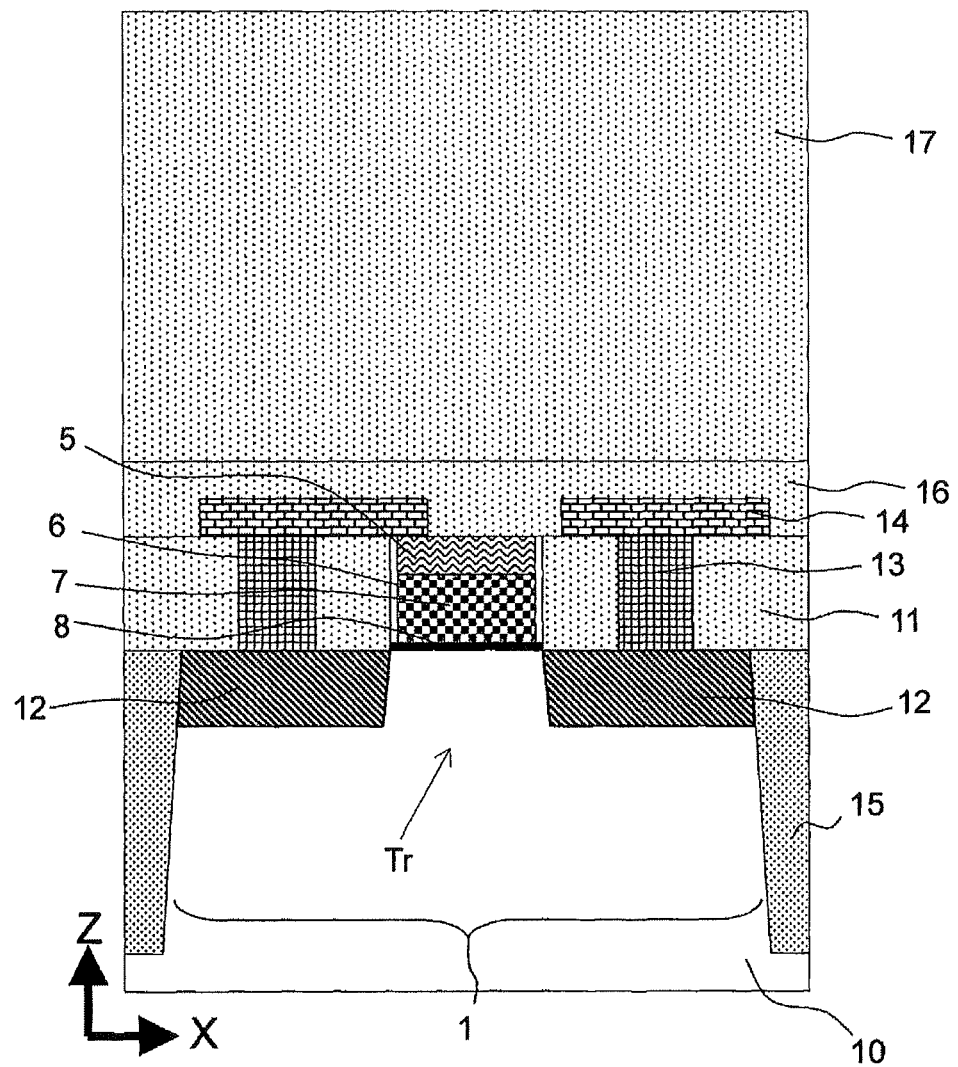
FIG. 2 is a cross-sectional view illustrating a method of manufacturing the first example of a semiconductor device.

First, as illustrated in FIG. 2, the semiconductor substrate 10 is prepared, and the element isolation region 15 is formed within the semiconductor substrate 10 by a known method. By this means, the active region 1 is formed within the semiconductor substrate 10 in such a way that it is demarcated by the element isolation region 15. An insulating film, a conductive film and a cover insulating film are formed successively on the semiconductor substrate 10, after which these films are successively patterned to form, respectively, the gate insulating film 8, the gate electrode 7 and the cover insulating film 5. An insulating film such as a silicon nitride film is formed on the semiconductor substrate 10, after which etching is performed. By this means, the side-wall insulating film 6 is formed on the side surfaces of the gate insulating film 8, the gate electrode 7 and the cover insulating film 5.

The source/drain diffusion layers 12 are formed by implanting impurities into the semiconductor substrate 10 using the cover insulating film 5 as a mask. The first interlayer insulating film 11 is formed on the semiconductor substrate 10 using a known method, after which it is planarized until the cover insulating film 5 is exposed. Using a known method, the contacts 13 are formed such that they penetrate through the first interlayer insulating film 11 and are connected to the source/drain diffusion layers 12. A conductive film is formed on the first interlayer insulating film 11, after which the conductive film is patterned to form the peripheral wiring lines 14. Next, using a known method, the stopper film 16 and the second interlayer insulating film 17 are formed successively on the first interlayer insulating film 11 in such a way that they cover the peripheral wiring lines 14.

Figure 3:
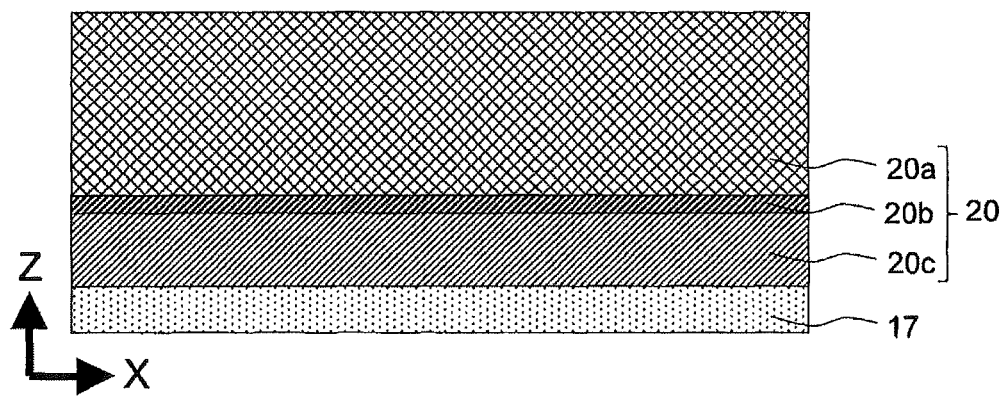
FIG. 3 is a cross-sectional view illustrating the method of manufacturing the first example of a semiconductor device.

As illustrated in FIG. 3, the SiCN film 20c, the first silicon nitride film 20b, and the silicon dioxide film or the SiOC film 20a are formed in that order, as the third interlayer insulating film 20, on the second interlayer insulating film 17, using a CVD method or the like.

Figure 4:
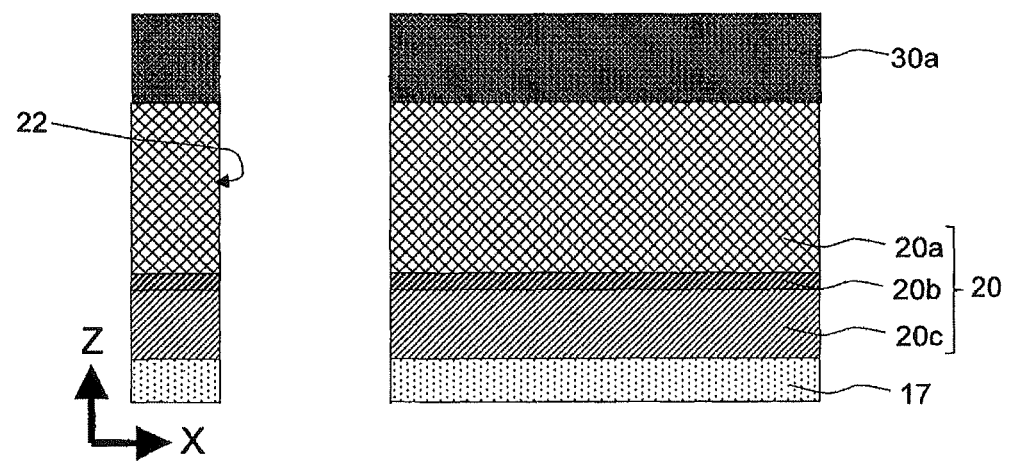
FIG. 4 is a cross-sectional view illustrating the method of manufacturing the first example of a semiconductor device.

As illustrated in FIG. 4, a photoresist 30a is formed on the SiOC film 20a, after which a lithographic technique and a dry etching technique are used to form a first via hole 22 which penetrates through the second and third interlayer insulating films 17, 20 and the stopper film 16 (which is not shown in the drawing) to expose the peripheral wiring line 14 (which is not shown in the drawing).

Figure 5:
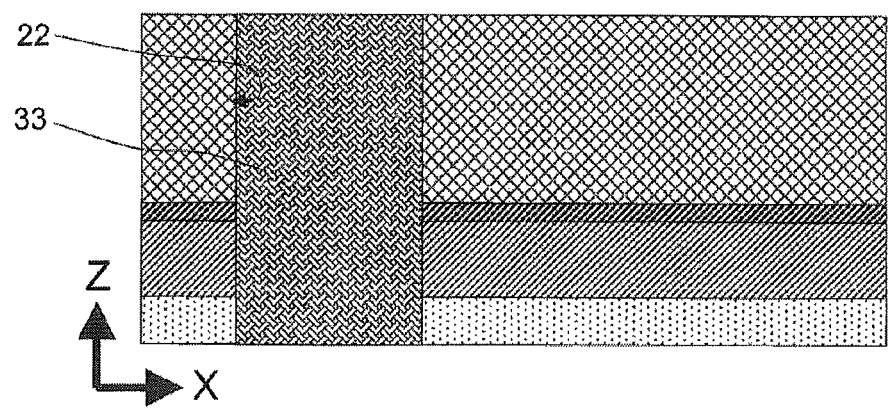
FIG. 5 is a cross-sectional view illustrating the method of manufacturing the first example of a semiconductor device.

As illustrated in FIG. 5, a BARC film (antireflective film) 33 is applied over the entire surface such that it fills the first via hole 22, after which etch-back is performed so that the BARC film 33 remains only in the first via hole 22.

Figure 6:
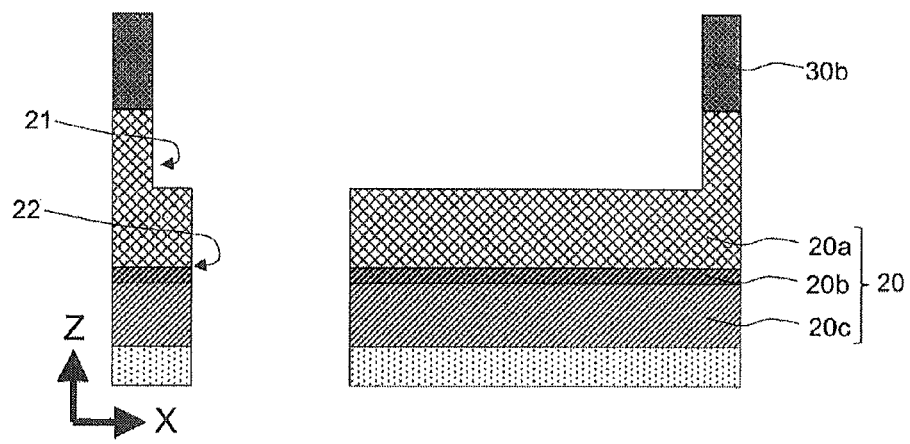
FIG. 6 is a cross-sectional view illustrating the method of manufacturing the first example of a semiconductor device.

As illustrated in FIG. 6, a photoresist 30b is applied over the third interlayer insulating film 20, after which a lithographic technique and a dry etching technique are used to open a first trench 21 for the first wiring line. When this dry etching is performed, it is desirable for the BARC film 33 in the first via hole 22 to have been completely removed when the etching of the silicon dioxide film or the SiOC film 20a to the depth of the first trench 21 has been completed. It should be noted that if the BARC film 33 remains in the first via hole 22 after the dry etching has been performed, the BARC film 33 may be removed using etch-back.

Figure 7:
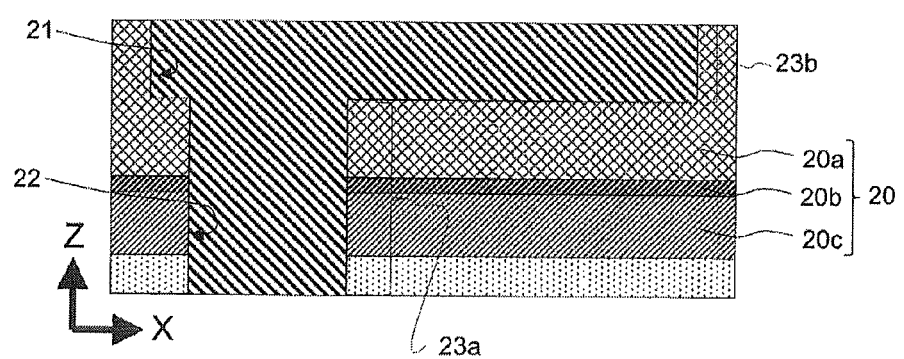
FIG. 7 is a cross-sectional view illustrating the method of manufacturing the first example of a semiconductor device.

As illustrated in FIG. 7, a copper film (Cu film) is deposited over the entire surface such that it fills the first via hole 22 and the first trench 21. Next, the first via plug 23a and the first wiring line 23b are formed by grinding the copper film using CMP until the upper surface of the third interlayer insulating film 20 is exposed. As described hereinabove, the first via plug 23a and the first wiring line 23b are formed by damascene processing.

Figure 8:
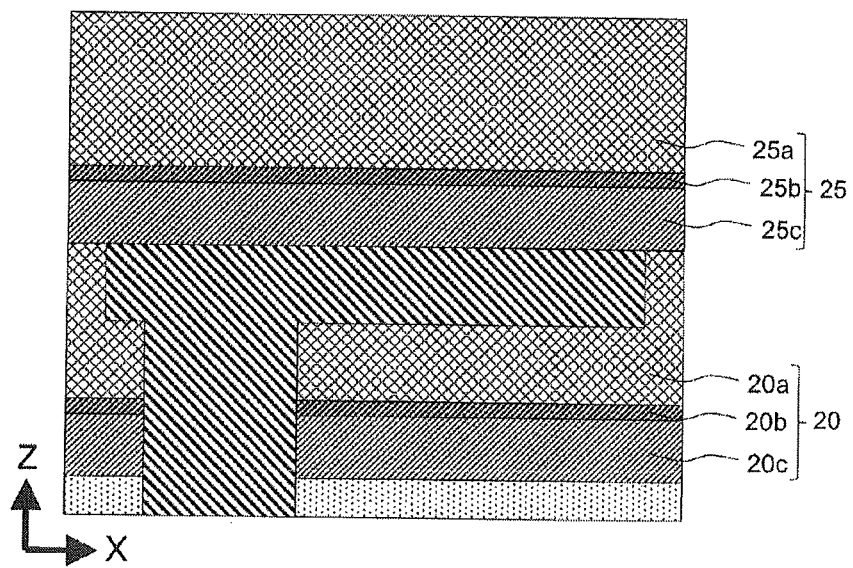
FIG. 8 is a cross-sectional view illustrating the method of manufacturing the first example of a semiconductor device.

As illustrated in FIG. 8, the SiCN film 25c, the first silicon nitride film 25b, and the silicon dioxide film or the SiOC film 25a are formed in that order, as the fourth interlayer insulating film 25, on the third interlayer insulating film 20, using a CVD method or the like.

Figure 9:
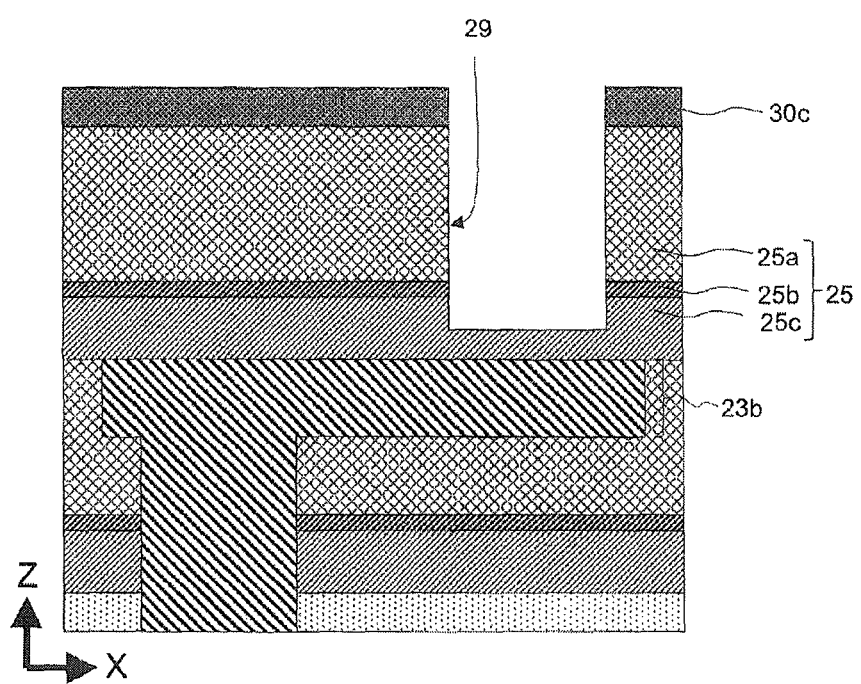
FIG. 9 is a cross-sectional view illustrating the method of manufacturing the first example of a semiconductor device.

As illustrated in FIG. 9, a photoresist 30c is applied over the fourth interlayer insulating film 25, after which a lithographic technique and a dry etching technique are used to form a second via hole 29 in the fourth interlayer insulating film 25. At this time, the second via hole 29 is formed in such a way that approximately 80 nm of the SiCN film 25c remains above the first wiring line 23b. The reason for this is that if the second via hole 29 is formed in such a way as to expose the first wiring line 23b, the surface of the first wiring line 23b will oxidize, increasing its resistance, during the period in which the second via plug and the second wiring line are being formed in subsequent processes.

Figure 10:
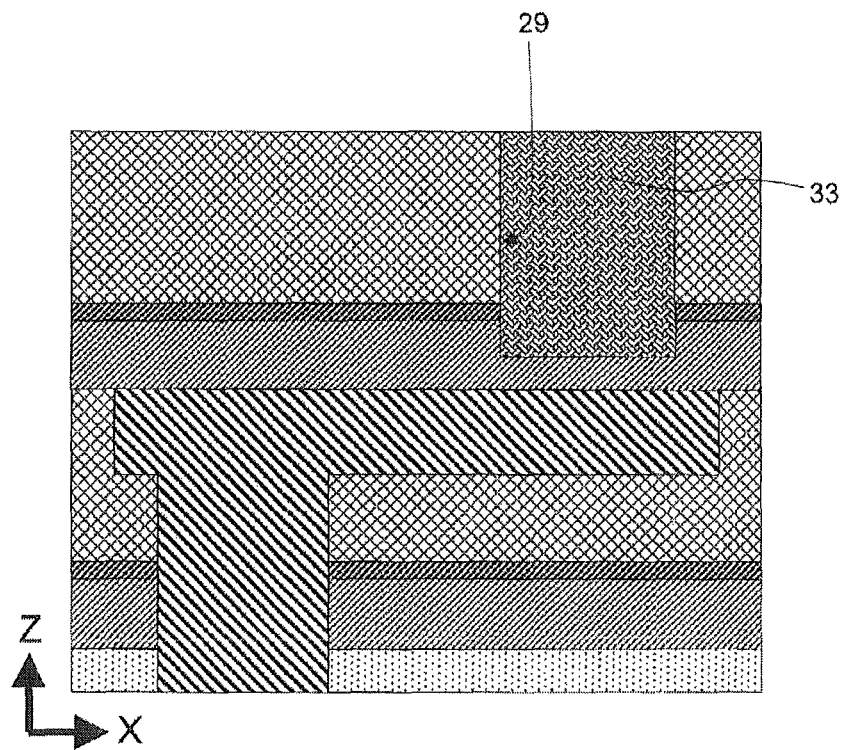
FIG. 10 is a cross-sectional view illustrating the method of manufacturing the first example of a semiconductor device.

As illustrated in FIG. 10, the BARC film (antireflective film) 33 is applied over the entire surface such that it fills the second via hole 29, after which the BARC film 33 is etched back so that the BARC film 33 remains only in the second via hole 29.

Figure 11:
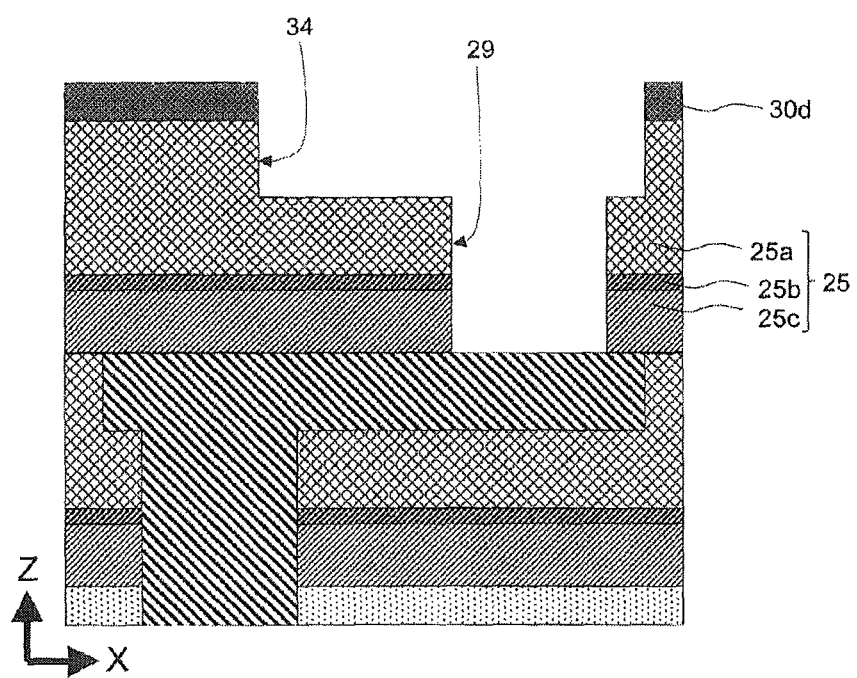
FIG. 11 is a cross-sectional view illustrating the method of manufacturing the first example of a semiconductor device.

As illustrated in FIG. 11, a photoresist 30d is applied, after which a lithographic technique and a dry etching technique are used to form a second trench 34 for the second wiring line. When this dry etching is performed, it is desirable for the BARC film 33 in the second via hole 29 to have been completely removed when the etching of the silicon dioxide film or the SiOC film 25a to the depth of the second trench 34 has been completed. It should be noted that if the BARC film 33 remains in the second via hole 29 after the dry etching has been performed, the BARC film 33 may be removed using etch-back.

Figure 12:
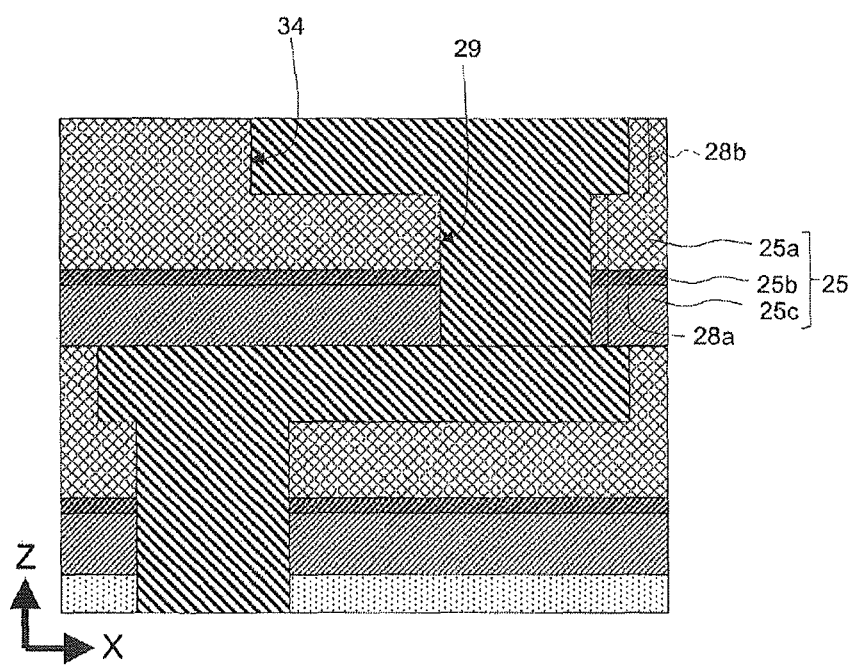
FIG. 12 is a cross-sectional view illustrating the method of manufacturing the first example of a semiconductor device.

As illustrated in FIG. 12, a copper film (Cu film) is deposited over the entire surface such that it fills the second via hole 29 and the second trench 34. Next, the second via plug 28a and the second wiring line 28b are formed by grinding the copper film using CMP until the upper surface of the fourth interlayer insulating film 25 is exposed. As described hereinabove, the second via plug 28a and the second wiring line 28b are formed by damascene processing.

Finally, as illustrated in FIG. 1, the protective insulating film 30 is deposited such that it covers the upper surface of the second wiring line 28b and the surface of the fourth interlayer insulating film 25, thereby completing this example of a semiconductor device.

Example 2

Figure 15:
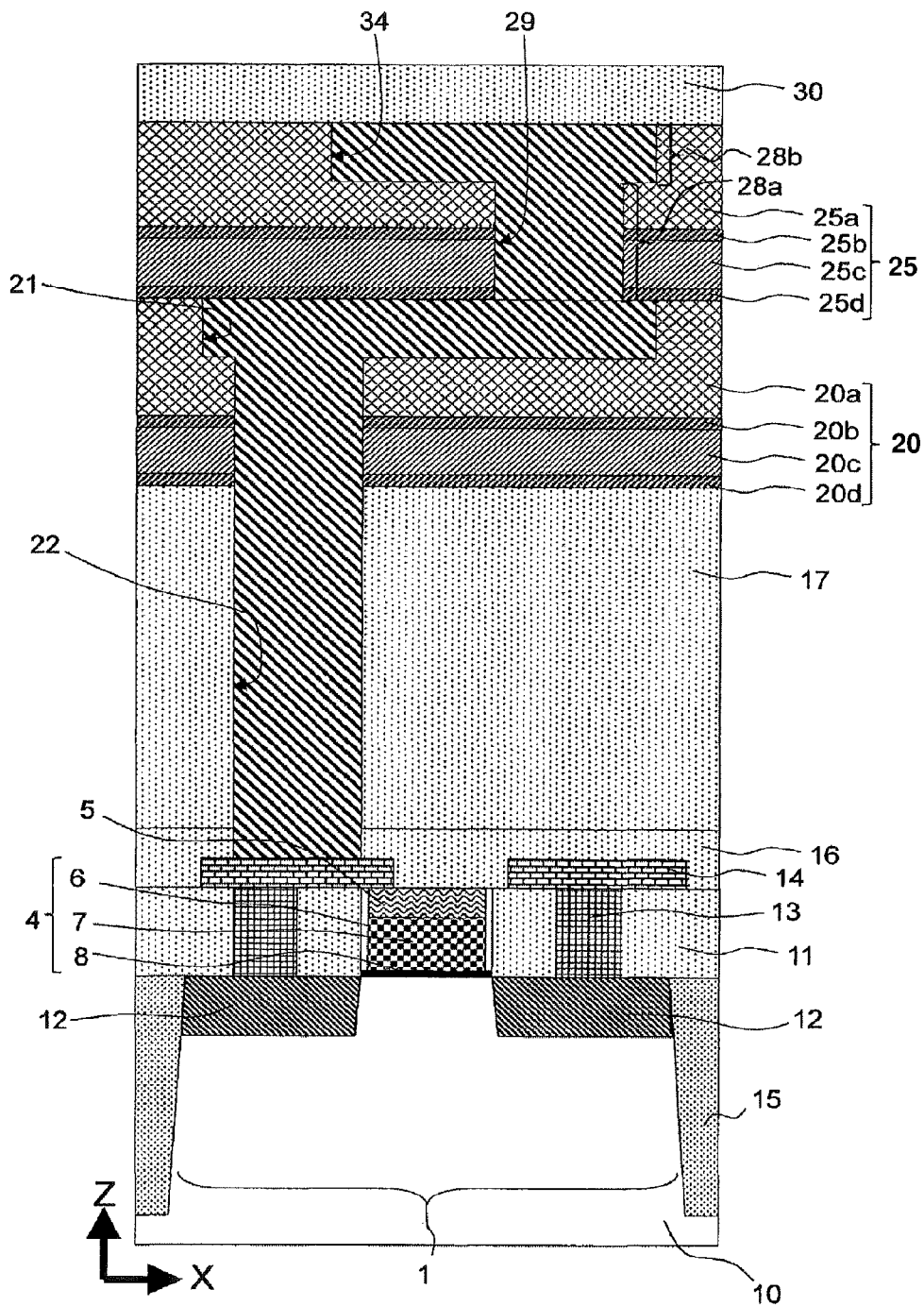
FIG. 15 is a cross-sectional view illustrating the second example of a semiconductor device.
Figure 16:
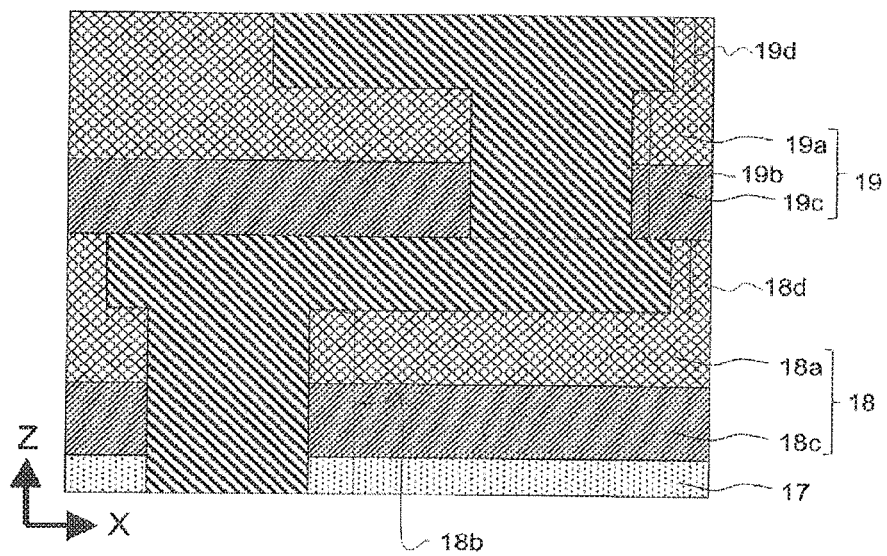
FIG. 16 is a cross-sectional view illustrating a conventional semiconductor device.

FIG. 15 is a cross-sectional view illustrating this example of a semiconductor device. This example differs from the first example in that second silicon nitride films 20d, 25d are additionally provided in the third and fourth interlayer insulating films 20, 25 respectively. Other structures are the same as in the first example, and thus detailed descriptions of these structures are omitted hereinbelow.

In this example, by providing the silicon nitride films ($Si_3N_4$ films) 20d, 20b, 25d, 25b respectively between the second interlayer insulating film 17 and the SiCN film 20c, between the SiCN film 20c and the silicon dioxide film or the SiOC film 20a, between the silicon dioxide film or the SiOC film 20a and the SiCN film 25c, and between the SiCN film 25c and the silicon dioxide film or the SiOC film 25a, it is possible to improve the adhesion between these films even more than in the first example. Thus in an assessment such as a pressure cooker test or a highly accelerated temperature and humidity stress test (test procedures, the objective of which is to assess the moisture resistance of an electronic component or the like sealed in resin), peeling of the films constituting the interlayer insulating film can be prevented more effectively. As a result, a deterioration in the device characteristics of the semiconductor device can be prevented.

Figure 13:
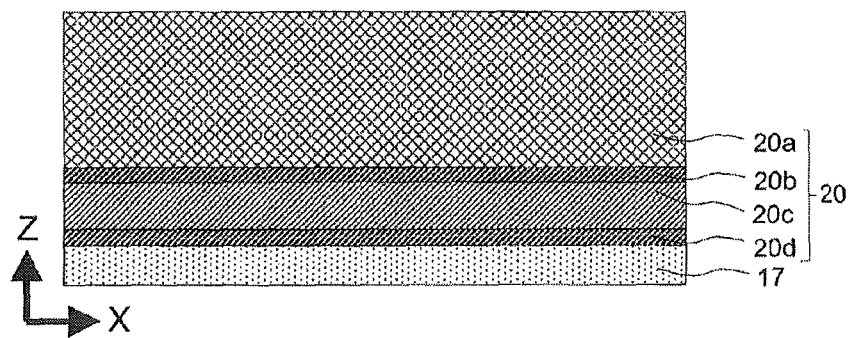
FIG. 13 is a cross-sectional view illustrating a method of manufacturing a second example of a semiconductor device.
Figure 14:
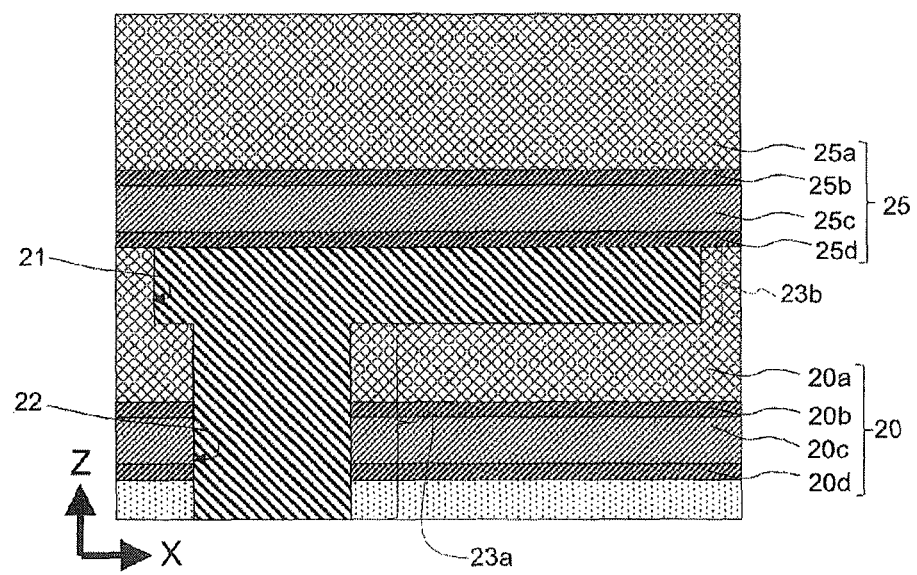
FIG. 14 is a cross-sectional view illustrating the method of manufacturing the second example of a semiconductor device.

A method of manufacturing this example of a semiconductor device will now be described with reference to FIGS. 13 to 15 and FIG. 17B. FIGS. 13 and 14 are cross-sectional views corresponding to FIG. 15, and FIG. 17B is a flowchart illustrating this example of a manufacturing method. It should be noted that the structures below the second interlayer insulating film 17 have been omitted from FIGS. 13 and 14.

The second interlayer insulating film 17 is formed using the same method as in the first example.

As illustrated in FIG. 13, the second silicon nitride film 20d, the SiCN film 20c, the first silicon nitride film 20b, and the silicon dioxide film or the SiOC film 20a are formed in that order, as the third interlayer insulating film 20, using a CVD method or the like.

As illustrated in FIG. 14, the damascene process in FIGS. 4 to 7 in the first example is carried out to form the first via plug 23a and the first wiring line 23b in the first via hole 22 and the first trench 21 respectively. Then the second silicon nitride film 25d, the SiCN film 25c, the first silicon nitride film 25b, and the silicon dioxide film or the SiOC film 25a are formed in that order, as the fourth interlayer insulating film 25, on the third interlayer insulating film 20, using a CVD method or the like.

As illustrated in FIG. 15, the damascene process in FIGS. 9 to 12 in the first example is carried out to form the second via plug 28a and the second wiring line 28b in the second via hole 29 and the second trench 34 respectively. Then the protective insulating film 30 is deposited such that it covers the upper surface of the second wiring line 28b and the surface of the fourth interlayer insulating film 25, thereby completing this example of a semiconductor device.

In the abovementioned first and second examples, descriptions were given of examples in which wiring lines and via plugs which penetrate through the third and fourth interlayer insulating films 20, 25 are formed in such a way that they are connected to the source/drain diffusion layers 12 of the planar-type transistor. The planar-type transistor, the via plugs and the wiring lines can for example be formed in a peripheral circuit region of a semiconductor device provided with a DRAM (Dynamic Random Access Memory). A memory cell region of such a semiconductor device can for example be formed together with the peripheral circuit region as described hereinbelow.

First an impurity is implanted into the memory cell region. Then line-and-space patterned trenches are formed in the memory cell region. By this means, impurity-implanted sections of the semiconductor substrate corresponding to the space sections are formed as source/drain diffusion layers. A gate insulating film, and an embedded gate electrode which serves as a word line, are formed on the side surfaces of the inner walls of the trench. An insulating film for a gate insulating film is then formed on the peripheral circuit region. Next, a conductive film and a cover insulating film are formed on the memory cell region and the peripheral circuit region. By patterning the insulating film for the gate insulating film, the conductive film and the cover insulating film, a bit line is formed in such a way that it comes into contact with one of the source/drain diffusion layers in the memory cell region, and the gate insulating film 8, the gate electrode 7 and the cover insulating film 5 are formed in the central portion of the active region 1 of the peripheral circuit region. Then the side-wall insulating film 6 is formed on both side surfaces of the gate electrode and the like of the peripheral circuit region, and the bit line of the memory cell region.

The first interlayer insulating film 11 is formed on the memory cell region and the peripheral circuit region, after which a capacitative contact is formed such that it comes into contact with the other source/drain diffusion layer in the memory cell region, and the contacts 13 are formed such that they come into contact with the source/drain diffusion layers 12 in the peripheral circuit region. A contact pad is formed such that it comes into contact with the contact in the memory cell region, and the peripheral wiring lines 14 are formed such that they come into contact with the contacts 13 in the peripheral circuit region. The contact pad and the peripheral wiring lines 14 may be formed in the same process, or they may each be formed in separate processes.

The second, third and fourth interlayer insulating films 17, 20, 25 and the protective insulating film 30 are then formed successively on the memory cell region and the peripheral circuit region. Further, in the course of forming these films, a capacitor connected to the contact pad is formed in the memory cell region. Further, as described in the abovementioned first and second examples, the first via plug 23a, the first wiring line 23b, the second via plug 28a and the second wiring line 28b are formed in the peripheral circuit region.

Further, the structures illustrated in the abovementioned first and second examples may for example form part of the structure of a flash memory or a logic circuit or the like.

The abovementioned first and second examples employ a single-damascene method in which the via holes and the trenches are formed in the third and fourth interlayer insulating films 20, 25 in separate processes. However, it is also possible to employ a dual-damascene method in which a via hole and a trench are formed in a single process.

It should be noted that the abovementioned first and second examples describe examples in which the first via plug 23a, the first wiring line 23b, the second via plug 28a and the second wiring line 28b are formed in the third and fourth interlayer insulating films 20, 25. However, the semiconductor device of the present invention may have three or more interlayer insulating films such as the third and fourth interlayer insulating films 20, 25, and three or more via plugs which penetrate through the interlayer insulating films and three or more wiring lines may be formed. Further, there may be one interlayer insulating film, and one via plug which penetrates through the interlayer insulating film and one wiring line may be formed.

EXPLANATION OF THE REFERENCE NUMBERS

1 Active region
5 Cover insulating film
6 Side-wall insulating film
7 Gate electrode
8 Gate insulating film
10 Semiconductor substrate
11 First interlayer insulating film 12 Source/drain diffusion layer
13 Contact
14 Peripheral wiring line
15 Element isolation region
14 Peripheral wiring line
16 Stopper film
17 Second interlayer insulating film
18, 19 Interlayer insulating film
18a, 19a Silicon dioxide film or carbon-containing silicon oxide film (SiOC film)
18b, 19b Via plug
18c, 19c Carbon-containing silicon nitride film (SiCN film)
18d, 19d Wiring line
20 Third interlayer insulating film
20a, 25a Silicon dioxide film or carbon-containing silicon oxide film (SiOC film)
20b, 25b First silicon nitride film
20c, 25c Carbon-containing silicon nitride film (SiCN film)
20d, 25d Second silicon nitride film
21 First trench
22 First via hole
23a First via plug
23b First wiring line
25 Fourth interlayer insulating film
28a Second via plug
28b Second wiring line
29 Second via hole
30 Protective insulating film
30a, 30b, 30c, 30d Photoresist
33 BARC film (antireflective film)
34 Second trench
Tr Transistor

The invention claimed is:

1. A semiconductor device comprising:
    an interlayer insulating film having, in this order, a carbon-containing silicon nitride (SiCN) film, a first silicon nitride film, and a silicon dioxide film or a carbon-containing silicon oxide (SiOC) film;
    a via plug provided in the interlayer insulating film; and
    a wiring provided in the interlayer insulating film such that the wiring line is in contact with the via plug.

2. The semiconductor device as claimed in claim 1, wherein the interlayer insulating film has, in this order, a second silicon nitride film, a carbon-containing silicon nitride (SiCN) film, a first silicon nitride film, and a silicon dioxide film or a carbon-containing silicon oxide (SiOC) film.

3. The semiconductor device as claimed in claim 1, wherein the wiring line formed from a same material as the via plug.

4. The semiconductor device as claimed in claim 3, wherein a plurality of the interlayer insulating films are laminated such that they lie on top of each other, the via plugs and wiring lines are provided in each of the interlayer insulating films, and the via plugs and wiring lines provided in each of the interlayer insulating films are electrically connected to each other.

5. The semiconductor device as claimed in claim 3, wherein the via plugs and wiring lines are formed from copper.

6. A method of manufacturing a semiconductor device, comprising:
    forming an interlayer insulating film having, in this order, a carbon-containing silicon nitride (SiCN) film, a first silicon nitride film, and a silicon dioxide film or a carbon-containing silicon oxide (SiOC) film;
    forming a via hole and a trench communicating with the via hole in the interlayer insulating film; and
    forming a via plug and a wiring line in the via hole and trench, respectively.

7. The method of manufacturing a semiconductor device as claimed in claim 6, further comprising forming the interlayer insulating film having, in this order, a second silicon nitride film, a carbon-containing silicon nitride (SiCN) film, a first silicon nitride film, and a silicon dioxide film or a carbon-containing silicon oxide (SiOC) film.

8. The method of manufacturing a semiconductor device as claimed in claim 6, wherein the via plug and the wiring line are formed by filling the via hole and trench with the same conductive material.

9. The method of manufacturing a semiconductor device as claimed in claim 8, wherein a cycle comprising the following (1) to (3) is repeated a plurality of times: (1) forming the interlayer insulating film, (2) forming the via hole and trench, (3) forming the via plug and wiring line, and, in the (3) in each cycle, the via plugs and wiring lines are formed such that the via plugs and wiring lines in each of the interlayer insulating films are electrically connected to each other.

10. The method of manufacturing a semiconductor device as claimed in claim 8, wherein the conductive material comprises copper.

* * * * *